United States Patent
Agapiou et al.

(10) Patent No.: US 9,046,577 B2
(45) Date of Patent: Jun. 2, 2015

(54) CORONA AND PARTIAL DISCHARGE DIAGNOSTIC DEVICE AND METHOD FOR USING THE SAME

(75) Inventors: John S. Agapiou, Rochester Hills, MI (US); Daniel L. Simon, Rochester, MI (US); John Patrick Spicer, Plymouth, MI (US); Edward Panozzo, Mokena, IL (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 752 days.

(21) Appl. No.: 13/085,773

(22) Filed: Apr. 13, 2011

(65) Prior Publication Data

US 2012/0265458 A1    Oct. 18, 2012

(51) Int. Cl.
| | |
|---|---|
| G01R 31/00 | (2006.01) |
| G01R 31/34 | (2006.01) |
| G01R 31/02 | (2006.01) |
| G01R 31/12 | (2006.01) |
| G01R 31/08 | (2006.01) |
| G01R 31/14 | (2006.01) |

(52) U.S. Cl.
CPC ............... *G01R 31/34* (2013.01); *G01R 31/02* (2013.01); *G01R 31/1227* (2013.01); *G01R 31/08* (2013.01); *G01R 31/1263* (2013.01); *G01R 31/14* (2013.01)

(58) Field of Classification Search
USPC .............................................. 702/35, 36, 59
See application file for complete search history.

(56) References Cited

U.S. PATENT DOCUMENTS

| | | | |
|---|---|---|---|
| 3,622,872 A | 11/1971 | Boaz | |
| 4,158,168 A | 6/1979 | Harrold et al. | |
| 4,158,169 A | 6/1979 | Harrold et al. | |
| 5,126,677 A | 6/1992 | Campbell et al. | |
| 5,252,927 A | 10/1993 | Bruhlmeier et al. | |
| 5,416,418 A * | 5/1995 | Maureira et al. | 324/535 |
| 5,416,430 A | 5/1995 | Twerdochlib et al. | |
| 5,530,366 A | 6/1996 | Nasrallah | |
| 5,844,461 A * | 12/1998 | Faulk et al. | 336/206 |
| 6,340,890 B1 | 1/2002 | Bengtsson et al. | |
| 7,285,960 B2 | 10/2007 | Koch et al. | |
| 7,579,843 B2 | 8/2009 | Younsi et al. | |

(Continued)

FOREIGN PATENT DOCUMENTS

| | | |
|---|---|---|
| JP | 2005069745 | 3/2005 |
| JP | 2008215865 | 9/2008 |
| JP | 2009025020 | 2/2009 |

*Primary Examiner* — Sujoy Kundu
*Assistant Examiner* — Paul D Lee
(74) *Attorney, Agent, or Firm* — Parks Wood LLC; Mickki D. Murray

(57) ABSTRACT

A method for diagnosing a fault in an electrical component using a diagnostic system having a plurality of sensors. The method includes positioning the electrical component in a predetermined position adjacent the diagnostic system and at a predetermined orientation with respect to the diagnostic system. The method also includes causing a predetermined level of electrical current to flow to the electrical component, the stationary sensors sensing electrical discharge emitted by the electrical component at an area of the fault, and the tangible computerized controller receiving sensor data from the sensors. The method further includes the tangible computerized controller executing the computer-readable instructions to process the sensor data to generate test information including a location of the electrical component at which the fault is occurring in at least two dimensions.

19 Claims, 6 Drawing Sheets

(56) References Cited

U.S. PATENT DOCUMENTS

| | | | |
|---|---|---|---|
| 2002/0196031 A1* | 12/2002 | Blades | 324/536 |
| 2004/0190231 A1* | 9/2004 | Iskander et al. | 361/623 |
| 2009/0167509 A1* | 7/2009 | Fadell et al. | 340/407.2 |
| 2011/0037666 A1* | 2/2011 | Behrmann | 343/703 |

* cited by examiner

CORONA AND PARTIAL DISCHARGE DIAGNOSTIC DEVICE AND METHOD FOR USING THE SAME

TECHNICAL FIELD

The present disclosure relates generally to apparatus and methods for diagnosing faults in electrical machines and, more particularly, to diagnosing faults in components of an alternating current induction motor.

BACKGROUND

Alternating current (AC) electric motors are a type of electric motor used in a variety of applications such as in electric vehicles. Electric motors are also commonly used in products to drive devices such as fans, pumps, and compressors, and in manufacturing processes to drive conveyor belts, saws, and other machinery. Some AC electric motors can also operate as a generator, such as an automobile alternator.

Electric motors include a stator component encircling a rotor component. For the power generation function, electric current is selectively supplied to wire windings of the stator, causing alternating electromagnetic fields within the stator.

The rotor has highly-conductive rods, such as a high-conductive aluminum, and the electromagnetic fields created in the windings of the stator induce current in the bars of the rotor, and interaction between the magnetic fields and the current in the bars cause the rotor to rotate, thereby generating power in the turning rotor. The turning rotor can provide drive to an electric or hybrid vehicle, a fan, pump, compressor, and other equipment.

Induction motors are sometimes referred to as asynchronous motors because an effective speed of a magnetic field created by the stator must be different than a speed of the rotor to induce current in the conductor bars of the rotor, and thereby cause the rotor to rotate.

To guide current through the stator as desired, the wound wires forming windings are surrounded by layers of insulation, which prevent electrical short circuits between the wires, turn-to-turn, phase-to-phase and turn-to-phase, and in some cases between the wires and other electrical features of the motor or other equipment adjacent the motor. The insulation can include any of a variety of materials and configurations. The insulation typically comprises an organic or non-organic dielectric material. The wires can be connected to the insulation in a variety of ways, such as by dipping the wires in a bath of the insulation or introducing the wires to slot liners, and then the wires and liners are introduced to a lamination stack. The lamination stack includes individual thin laminations of insulation material.

Wires are typically isolated from the lamination stack by the slot liners to avoid damaging the wires during insertion. If the lamination stack has sharp edges and burrs, it could lead to partial discharge, or Corona, when the wires inside are carrying current. Partial discharges are sometimes colloquially known by the acronym, PD.

If insulation is not comprehensive around the wires, electrical discharges can result from interaction with adjacent wires of the winding or between the exposed wire and other features of the motor or environment in which the stator is used. This interaction usually involves direct contact between the uncovered wires and another wire or conductor.

The insulation can be damaged as a result of a variety of manufacturing errors. For example, insulation materials could fail during insertion of the wires through slots of a lamination stack. The insulation material on the wires could also fail during bending of the wires to form the winds of the stator. In some cases, insufficient insulation is applied to a wire during a dipping process. In some cases, damage caused during the manufacturing process (such as pin hole, inclusions during the coating process, poor adhesion, etc.) does not produce an immediate failure of the insulation, but weakens the insulation to an extent that a premature failure occurs during the service life of the motor. When the insulation is defective, an electric field in the wire increases significantly at an outer surface of the wire.

If the defect is large enough, and so the concentrated electrical field at the defect is large, electricity will discharge from the wire in an electrical discharge. More particularly, a corona or partial discharge are photons being emitted in response to ionization of air or a local high-electric field. In cases of significant damage to insulation, the electrical discharge will be large enough to form of an electrical arc, causing the motor to fail by short circuit. In cases where insulation has been damaged to a lesser degree, lower-magnitude, or partial, discharges can result, generating a corona that typically does not itself cause the stator to fail. Repeated coronas, though, can progressively damage the insulation, eventually leading to failure of the motor.

It is therefore a goal of the presently disclosed technology to anticipate coronas at an early stage in a manufacturing process by detecting a problem with wire insulation, a slot liner, etc.

Coronas generate audio noise and radio interference that is not visible in the light because it is mostly in the ultraviolet (UV) range. On new motors, a corona generally indicates that one of various common problems are present, such as a faulty assembly, a problem with wire insulation, a problem with liner insulation, a problem with stator lamination slot quality, or a problem with wire bending. Hence, the present technology includes apparatus and methods for checking for corona soon after a motor component is assembled, locating any identified corona therein, and taking advised actions early, such as before the motor component is incorporated into a motor assembly, and before an arc or short are formed.

Photon detection systems are available commercially for motor inspection. These systems typically include a camera being manually employed to determine whether a partial discharge has occurred. Ultraviolet camera systems have also been used to detect corona events. These systems, though, are limited to identifying only corona discharges that are visible to the camera. That is, these systems cannot recognize discharges that occur deeper within the stator because the resulting ultraviolet radiation does not reach a surface of the stator. These systems, though, are not able to identify a particular location of the partial discharge in the component.

SUMMARY

The present disclosure relates to a method for diagnosing a fault in an electrical component using a diagnostic system having at least three stationary sensors. The method includes positioning the electrical component in a predetermined position adjacent the diagnostic system and at a predetermined orientation with respect to the diagnostic system. The method also includes causing a predetermined level of electrical current to flow to the electrical component, the stationary sensors sensing electrical discharge emitted by the electrical component at an area of the fault, and the tangible computerized controller receiving sensor data from the stationary sensors. The method further includes the tangible computerized controller executing the computer-readable instructions to process the sensor data to generate test information including a location of the electrical component at which the fault is occurring in at least two dimensions.

In another aspect, the present disclosure relates to a method for diagnosing a fault in an electrical component using a diagnostic system having at least two directional sensors. The method includes positioning the electrical component in a predetermined position adjacent the diagnostic system and at a predetermined orientation with respect to the diagnostic system. The method also includes affecting relative motion between the sensors and the electrical component and causing a predetermined level of electrical current to flow to the electrical component. The method further includes the sensors sensing electrical discharge emitted by the electrical component at an area of the fault while the relative motion is being affected and the current is flowing to the electrical component. The method yet further includes the tangible computerized controller receiving sensor data from the sensors and executing the computer-readable instructions to process the sensor data to generate test information including a location of the electrical component at which the fault is occurring in at least two dimensions.

In another aspect, the present disclosure relates to a diagnostic system for diagnosing an electrical component. The diagnostic system includes at least two sensors for sensing a discharge emitted by a fault of the electrical component and a computerized controller. The controller is operatively connected to the sensors and includes a memory storing computer-readable instructions and a processor configured to perform the computer-readable instructions. In executing the instructions, the processor receives sensor data from the sensors and processes the sensor data to generate test information including a location of the electrical component at which the fault is occurring in at least two dimensions.

Other aspects of the present invention will be in part apparent and in part pointed out hereinafter.

Figure 1:
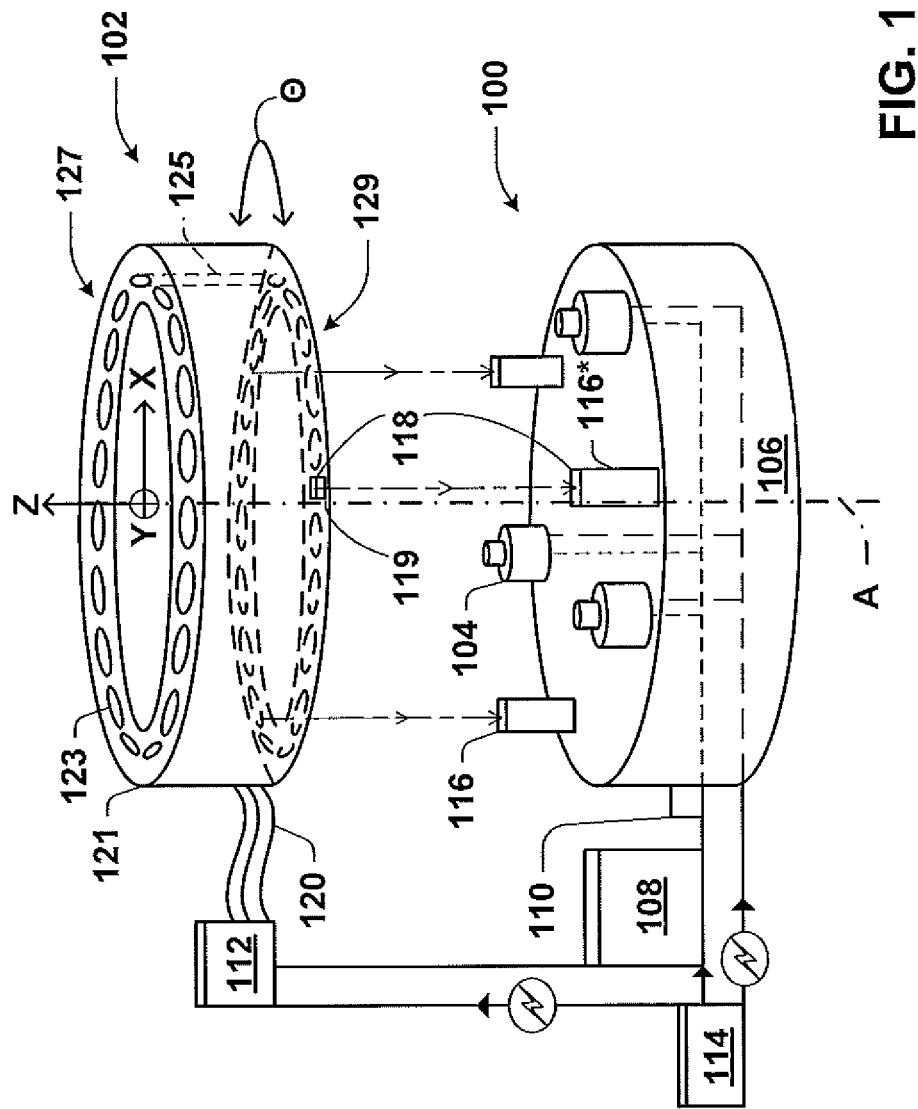
FIG. 1 is a front elevation view of a diagnostic system for evaluating a stator of an electrical motor, according to a one embodiment.

Other aspects of the present technology will be in part apparent and in part pointed out in the detailed description and claims that follow.

DETAILED DESCRIPTION

As required, detailed embodiments of the present disclosure are disclosed herein. The disclosed embodiments are merely examples that may be embodied in various and alternative forms, and combinations thereof. As used herein, for example, "exemplary," and similar terms, refer expansively to embodiments that serve as an illustration, specimen, model or pattern. The figures are not necessarily to scale and some features may be exaggerated or minimized, such as to show details of particular components. In some instances, well-known components, systems, materials or methods have not been described in detail in order to avoid obscuring the present disclosure. Therefore, specific structural and functional details disclosed herein are not to be interpreted as limiting, but merely as a basis for the claims and as a representative basis for teaching one skilled in the art to employ the present disclosure.

Overview of the Disclosure

The present disclosure describes systems and methods for diagnosing at least one electrical fault in an electrical component. Diagnosing an electrical fault includes determining that the fault exists and identifying one or more of a location of the fault, a magnitude of output from the fault (e.g., heat or sound), a frequency of the output from the fault, a wave form or other signature of output from the fault, a character or type of the fault, and in some cases a suggested remedy for the fault or other act to take with respect to the faulting component.

As provided, the systems and methods of the present technology in some embodiments also include remedying the fault based on results of the diagnosing functions. For example, an electrical problem at an identified location and determined to be caused by wire insulation, or lamination, that is too thin, or has a crack or other unwanted porosity, could be remedied by thickening, patching, or otherwise reinforcing the insufficient insulation at the identified location.

Although the present disclosure describes systems diagnosing electrical faults in a stator component of an electrical motor, primarily, it will be appreciated that the disclosed concepts can be used to diagnose electrical faults in any of a wide variety of electrical components. For example, the present technology can be used to diagnose electrical faults in any kind of electrical component, such as a rotor of an electric motor, or any other electrically component of an electric motor that might experience unwanted discharges. The present technology can be used to diagnose electrical faults in stators or rotors for induction motors and also permanent magnet motors.

Other exemplary electrical components that can be analyzed include electrical generators, alternators, transformers, and other electric equipment that may experience an electrical fault. Accordingly, descriptions of systems and methods provided below in connection with a stator should be interpreted as also being applicable to any other electrical components.

Apparatus Having Multiple Stationary Sensors

Referring now to the figures, and more particularly the first figures, FIG. 1 is a front elevation view of a diagnostic system 100 for evaluating a stator 102 of an electrical motor (motor not shown in full), or for evaluating another electrical device. The diagnostic system 100 includes multiple sensors 104 connected to a body 106 of the system 100. The number, type, and positioning of the sensors 104 is described below.

The system 100 also includes a controller 108. The controller 108 controls operations of the diagnostic system 100, including receiving and analyzing data output by the sensors 104. In some embodiments, the controller 108 controls a current (e.g., a voltage of the current) selectively supplied to the stator 102 during operation of the diagnostic system 100. The controller 108 is in some embodiments a computer, such as the computer described below in connection with FIG. 4. In some embodiments, the controller 108 includes a human operator and/or such a computer.

The controller 108 could be, for instance, a computer operating autonomously or at the direction of a human operator. Accordingly, the diagnostic system 100 can be partially or fully automated. In some contemplated embodiments, some functions of the diagnostic system 100 are fully automated and other functions are partially automated or manual. For example, as described below, the stator 102 may be placed by a person and/or automated machinery in position for being analyzed by the diagnostic system 100.

In embodiments having a computerized controller, the controller 108 connects to the body 106 at a controller input 110. The controller input 110 may include one or more standard electrical and communication interfaces. Although the controller 108 is shown standing alone from the body 106 of the diagnostic device 100, in some embodiments the controller 108 is positioned within the body 106 or otherwise integral to (e.g., directly adjacent and contacting) the body 106.

As also shown in FIG. 1, the diagnostic system 100 also includes a switch 112 or other intermediate electrical junction for controlling flow to the stator 102. Though the switch 112 is shown spaced from the controller 108, for some embodiments in which the controller 108 is at least partially computerized, the switch 112 is integrally associated with the controller 108, such as by the switch 112 being positioned within a common housing with, or being connected directly adjacent, a housing of the controller 108.

With further reference to FIG. 1, the diagnostic system 100 includes a connection 114 to a power source. For embodiments in which the power source is local to the diagnostic system 100, the box labeled 114 in FIG. 1 can also represent the power source itself. The power source provides power to the sensors, the controller 108 and, directly or by way of the switch 112, to the stator 102. The power source may be, for example, a local battery or a hard-wired line to a central or remote power source. It will be appreciated that although connection to a single power source is illustrated, various devices in FIG. 1 (e.g., the sensors, controller, and stator) can be powered by one or more separate power sources.

The diagnostic system 100, and more particularly the sensors 104, may be positioned in a variety of orientations. In the embodiment of FIG. 1, the system 100 has a generally vertical orientation, wherein the sensors 104 are arranged to analyze a stator 102 positioned vertically above the sensors 104, in a Z direction. In another vertical arrangement, the sensors 104 are arranged to analyze a stator 102 positioned vertically below the sensors 104.

Figure 2:
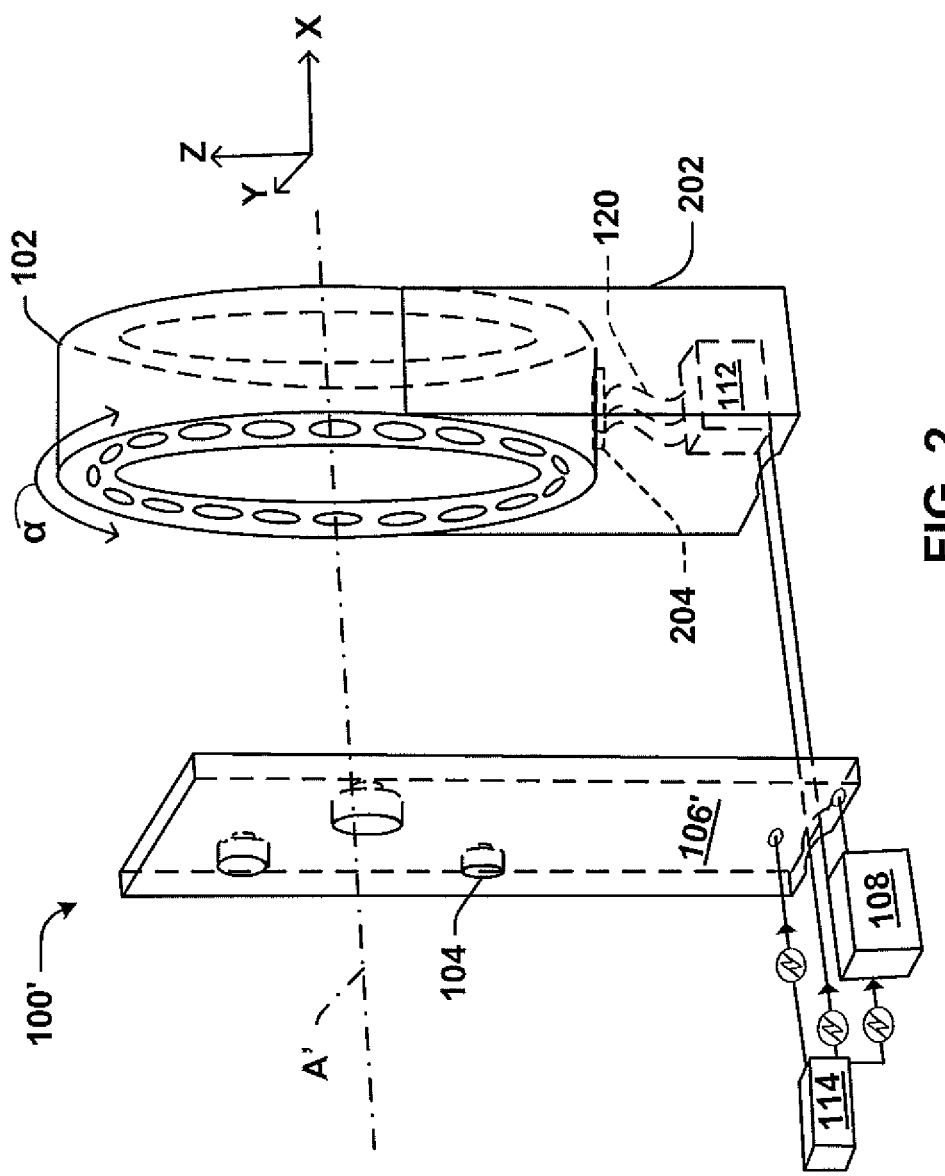
FIG. 2 is a front elevation of a diagnostic system for evaluating the stator according to another embodiment.

FIG. 2 shows an embodiment of the system 100' having a generally horizontal orientation. In the horizontal orientation, the sensors 104 are arranged to analyze a stator 102 spaced horizontally from the sensors 104, along an X direction.

The various directions (X, Y, Z, Θ, α) described herein are provided by way of examples, and for teaching purposes, and are not meant to limit the various implementations of the present technology. It will be appreciated that the diagnostic system 100 may generally be arranged at any orientation. For instance, in addition to the generally vertical and horizontal embodiments shown and described in connection with FIGS. 1-3 and 5, it is contemplated that the diagnostic system 100 may be positioned to have a general orientation along a line intermediate horizontal and vertical, with the sensors being partially or completely above or below the stator 102.

With continued reference to FIG. 1, the diagnostic system 100 in some embodiments includes one or more separators 116. The separators 116 include any of a wide variety of materials without departing from the scope of the present technology. For instance, the separators 116 may include an elasto-damping material.

The separators 116 may serve a variety of functions including controlling a separation distance between the stator 102 and one or both of the body 106 and the sensors 104 during operation of the diagnostic system 100. The separators 116 in some cases also provides a damping function by absorbing vibrations or other movement of the stator 102 or diagnostic system 100 during operation of the system 100. The separators 116 could also act to isolate the stator 102 from vibrations occurring in the environment that the stator is being tested in. In these ways, the separators 116 limit relative movement between the stator 102 and the diagnostic system 100, and more particularly between the stator 102 and the sensors 104.

In some embodiments, separators are also provided between the body 106 of the diagnostic system 100 and a floor, work bench, table or other supporting structure. The diagnostic system 100 may be a stage of an assembly line or another manufacturing environment. In such environments, vibrations from heavy equipment such as forklifts, railcars, and nearby manufacturing equipment may reach the diagnostic system 100. The separators 116 dampen these vibrations so that they do not reach, or only negligibly reach the stator 102 and/or the sensors 104 during testing.

As shown in FIG. 1, the stator 102 can rest on the separators 116. For operation of the diagnostic system 100, a human or automated positioning sub-system positions the stator 102 adjacent the diagnostic system 100 by setting the stator 102 on the separators 116. An exemplary positioning sub-system 302 is shown schematically in connection with the diagnostic system 100" shown in FIG. 3. Schematically shown features of the system or test component do not limit the shape, size, or type of the features that can be used to perform the described functions.

In some embodiments, positioning the stator 102 for evaluation includes positioning the stator 102 in a preselected angular location with respect to the base 106, or at least with respect to the sensors 104. That is, the stator 102 is positioned to have a predetermined orientation in the angular direction Θ about an axis A along which the stator 102, and base 106 and sensors 104 of the diagnostic system 100, are arranged. In the embodiment of FIG. 2, the angular direction α is defined with respect to a horizontal axis A' along which the stator 102, and base 106' and sensors 104 of the diagnostic system 100', are arranged.

For only the identification function of the diagnostic system 100—i.e., merely identifying that an electrical fault exists in the stator 102, an exact alignment between the diagnostic system 100, and more particularly the sensors 104, is not necessarily needed. For identifying a particular location of the fault, the stator 102 should be located in a particular position with respect to the diagnostic system 100, or at least with respect to the sensors 102. This is because the sensors 104 have known positions with respect to each other, and knowing a position of the stator 104 with respect to the sensors 104 allows the controller 108 to determine the location of a fault in the stator 102 by determining a location of the fault with respect to the sensors 104. The process of determining a location of a detected fault is described further below, including in connection with the method 600 illustrated in FIG. 6.

In some embodiments, one or both of the stator 102 and the diagnostic system 100 includes an alignment feature 118 to control angular position—i.e., a position of the stator 102 with respect to the base, or at least with respect to the sensors 104, in the angular direction Θ, a shown in FIGS. 1 and 2, respectively. The alignment feature 100 may comprise mating components of the stator 102 and the diagnostic system 100. In the embodiment shown in FIG. 1, the alignment features 118 include (i) a first aspect 119, such as a notch, groove, depression, or the like, of the stator 102, such as in the lamination stack 121, and (ii) a select one 116* of the separators 116 that engages the notch or other feature of the stator 102 to align the stator 102 in the angular direction Θ with respect to the sensors 104. This process can also align the stator 102 properly in other directions, such as the X and Y directions.

In a contemplated embodiment, a component of the diagnostic system 100 engages an intrinsic feature of the stator 102, being a feature that is not a part of the stator 102 for the sole purpose of orientating the stator in the diagnostic system 100. The alignment features 118 shown in FIG. 1 are meant to represent both embodiments: the embodiment in which the feature 118 is made a part of the stator 102 for purposes of the alignment and embodiments in which the feature is an intrinsic part of the stator 102, having purposes other than the alignment.

In some embodiments, automated machinery, such as a robot is instrumental in the location process (Reference positioning sub-system 302 shown in FIG. 3 and described in associated text herein below). The automated machinery locates the stator 102 in the device 100 using a feature on the stator 102 (e.g., notch shown in FIG. 1 in connection with features 118). The lamination stack 121 has feature(s) such as a groove on the outside diameter to align it with locator 116*. In most cases, the same feature is also used for the assembly of the stator in the motor housing.

The alignment features 118 may also or alternately operate to align the stator 102 laterally with respect to the base, or at least with respect to the sensors 104. That is, using the example of FIG. 1, by aligning the notch and select separator 116*, proper position of the stator 102 with respect to the sensors 104 in the lateral directions X, Y is ensured.

In some embodiments, lateral alignment is achieved in the same process as the angular. For example, fingers or other components of automated machinery (e.g., the positioning sub-system 302 of FIG. 3) locates the stator 102 with respect to system 100, including properly orientating the stator 102. Aspects of the positioning machinery, such as fingers, can be configured and controlled to engage a select portion or portions of the stator 102. The positioning machinery is retracted before starting the test.

The diagnostic system 100 may include any of a wide variety of types of sensors 104. Generally, selected sensors 104 are capable of sensing one of various output of a discharge from an electrical breakdown or fault in the stator 102.

As referenced above, electrical faults can occur, for instance, in connection with improperly insulated current-carrying wires coming into unintended contact or close proximity to each other or another electrified part. An electric fault can also result from misplaced wires coming into unintended contact or close proximity to each other or another electrified part. Wires of the stator are schematically illustrated in FIG. 1 by reference number 123. As well known, the wires 123 of the stator 102 pass through the lamination stack 121, as indicated for example by reference line 125.

In many electrical faults, a spark is created between contacting or closely-adjacent wires. For wires having insulation, the spark can pass around an end of the insulation, through an unwanted pore (e.g., crack) in the insulation, or through an insufficiently-thin insulator. Momentary sparking is sometimes referred to as a partial electrostatic discharge, or corona. Coronas are caused by ionization of air surrounding the wires causing generation of the spark.

Under certain conditions, such as if insulation of sufficiently-close wires is particularly thin or absent a more continuous discharge, or arc, will result. Arcs cause failure by short circuit of the electrical component, such as the stator 102. Wires can have particularly thin or absent insulation from an initial manufacturing of the stator 102, or insulation can become particularly thin or absent by wear or by one or more partial discharges at the trouble spot.

As provided, sensors 104 used with the present diagnostic system 100 can measure one or more output of electrical discharges. Exemplary sensors 104 include thermal, or heat sensors, ultraviolet (UV) sensors, acoustic sensors, electro-magnetic (EM) sensors, and radio frequency (RF) sensors. Electrical discharges produce heat, which can be measured by heat sensors. An exemplary heat sensor is a heat flux transducer. Because a corona manifests as a plasma, it is visible under ultraviolet light (e.g., as glowing blue/white), and so can be sensed by a UV sensor. Similarly, discharges create some level of EM energy and RF energy measurable by corresponding sensors. Also, discharges give off a sound in an ultrasonic frequency, and so can be sensed by acoustic sensors capable of sensing the expected ultrasonic frequencies.

A sensitivity of the sensors 104 depends on variables including a magnitude of fault sought to be detected. For instance, if it is desired to detect very-small discharges, then sensors 104 of correspondingly very-high sensitivity will be used. Likewise, sensors 104 having a lower sensitivity would be sufficient to sense only discharges above a certain higher level or threshold.

In some embodiments, the sensors 104 are selected or configured to sense only output of electrical faults above a predetermined level. For example, it may be determined by a designer of the system 100 that discharges smaller than a certain level, and therefore producing output below a certain level, are not problematic—i.e., not expected to lead to failure during the operational life of the stator 102. The designer may arrive at this conclusion by way of testing, actual operation, feedback from the field in which stators 102 are being used, or otherwise.

As described in more detail below in connection with methods of operating the present diagnostic system 100, a location of an electrical fault in the stator 102 is determined using data from the multiple sensors 104. Generally, for stationary sensors 104—i.e., those that do not required relative motion between the sensors and the stator 102, at least three sensors 104 are needed, as shown in FIG. 1. An array of four or more sensors 104 may also be used. In some embodiments, a combination of two or more types of sensors are used, which can in some instances result in further improved diagnosis of faults.

Ultransonic sensors are one of the types that have been found particularly helpful in early-stage detection of discharge, when the discharge is typically very small and cannot be detected by other systems. In some cases, ultrasonic waves generated by coronas or partial discharges are the range of 40,000 Hz. Thus, in some embodiments, the present technology includes ultrasonic sensors capable of sensing discharge output having a frequency level of about 40,000 Hz to diagnose deteriorated or otherwise damaged insulation. For example, in one particular embodiment it is preferred that the sensors focus on a frequency range of about 38-44 KHz. As provided, a designer of the present system 100 may select sensors to have a desired sensitivity, based on particular needs, within other ranges.

In some embodiments, the system 100 is configured to detect only airborne ultrasound. In this way, the motor or motor component 102 can be analyzed directly for partial discharge while the motor or component 102 sits on a fixture (e.g., bench, stand, etc.). In a specific embodiment, the sensors 104 include one or more piezo-electric microphones for detecting ultrasonic sound emitted by an electrical component, without contacting the component (i.e., non-contact), such as sound waves up to 40 KHz.

A location of the electrical fault is determined based on at least one of (i) times at which output from the fault are sensed by the various sensors 104, (ii) known speed of the corresponding output (e.g., speed of UV emissions), and (iii) magnitudes of output sensed by each of the sensors 104. In some embodiments, the controller 108 uses multilateration, trilateration, triangulation, or another geometric process for point determination.

Multilateration is also known as hyperbolic positioning. Multilateration involves locating the fault by accurately computing a time difference of arrival (TDOA) of output from the fault sensed at three or more sensors 104.

Trilateration is a process for determining intersections of three sphere surfaces given the centers and radii of the three spheres. In the case of three sensors 104, the sensors 104 define respective centers of three spheres. While spheres are discussed primarily, trilateration can also be performed by analyzing triangles defined by the various sensors 104, instead.

The geometric analysis of data from the sensors 104 can be used to determine a location of the electrical fault in one, two, or three dimensions. That is, geometric analysis of data from the sensors 104 can be used to determine a location of the electrical fault in any one or more of the X direction, the Y direction, and the Z direction shown in FIGS. 1-3 and 5.

Signals from the sensors 104 are monitored by signal-processing software. The signal-processing software may be a part of the sensor 104 or a part of the computer controller 108. The signal-processing software analyzes one or more aspects of the sensor signals, such as amplitude and frequency. Amplitude and frequency, and any change in amplitude and frequency over time, define a wave form, and the signal-processing software can also analyze the wave form. The signal-processing software can also be configured to effectively lower sensitivity of the sensors 104 by processing only output above a certain level, within a certain range, or above and below certain levels. For instance, the software can be configured to filter out signals not having a frequency below or above a certain level, such as below about 40 kHz.

A sensor 104 having lower sensitivity, or an effective lower sensitivity by way of signal processing, would be less likely to sense output other than a maximum output of a fault, but would not sense even maximum output outside of the sensitivity level of the sensor 104. Signal processing is described in further detail below in connection with the method 600 illustrated in FIG. 6.

Isolation Chamber and Positioning Apparatus

Figure 3:
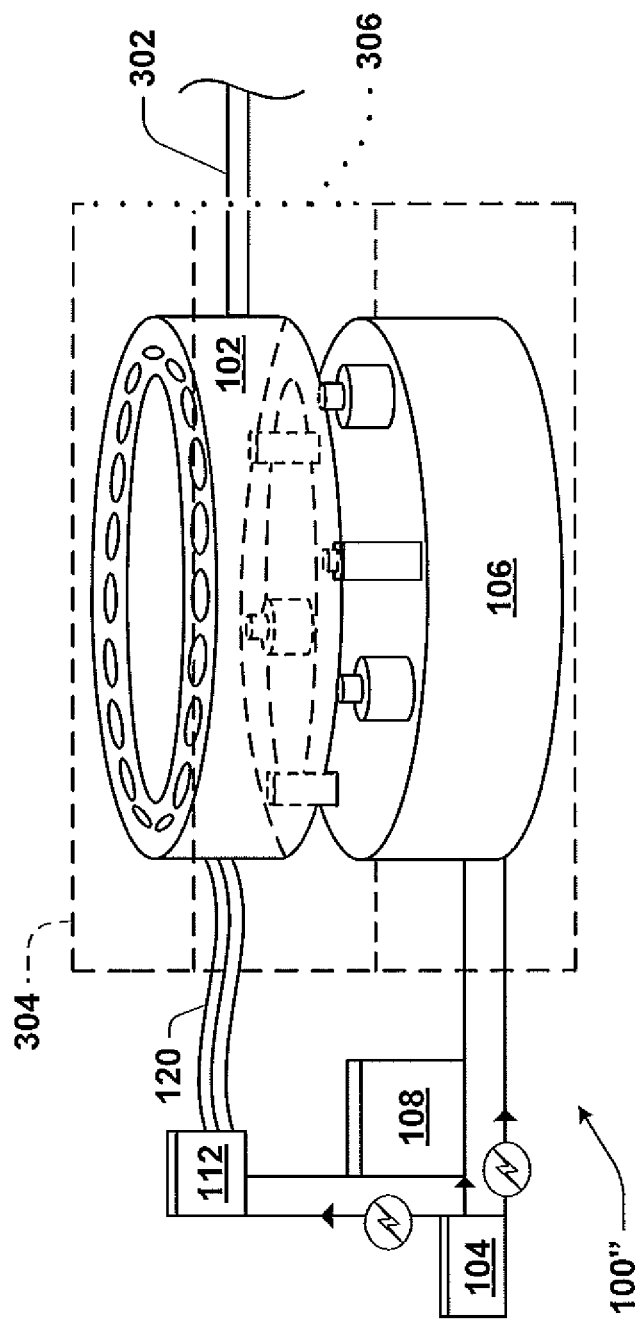
FIG. 3 is a front elevation of the diagnostic system and the stator of FIG. 1 partially enclosed by an isolation chamber.

As shown in FIG. 3, the diagnostic system 100" can be positioned within an isolation chamber 304. The isolation chamber 304 isolates the sensors 104 from environmental conditions surrounding the sensors 104 such as sound. In this way, the isolation chamber 304 can be sound-proof.

As provided, in scenarios the diagnostic system 100" is used to analyze stators 102 on a manufacturing floor of a manufacturing plant. Isolating the sensors 104 from ambient noise, especially in cases in which the ambient noise is loud, results in data having increased accuracy and so reliability and repeatability.

The stator 102 may be positioned in the chamber 304 in any of a variety of ways without departing from the scope of the present technology. For instance, the isolation chamber 304 in some embodiments includes an opening part 306 such as a retractable or hinged door, flaps, or the like, by which the stator 102 is passed. Opening and/or closing of the chamber 304, for input and egress of the stator 102, could be controlled by the controller 108. For instance, the controller 108 could be configured to control timing at which the opening part 306 opens and closes.

In one contemplated embodiment, the chamber 304 does not include an opening part 306. A designer of the system can determine that the chamber 304 without covering over the opening (considered shown by reference number 306 for this contemplated embodiment) is sufficient to isolate the testing environment as desired.

The isolation chamber 304 and process of introducing the stator 102 to the isolation chamber 304 are described in more detail below in connection with the method 600 illustrated in FIG. 6.

Computer Controller

Figure 4:
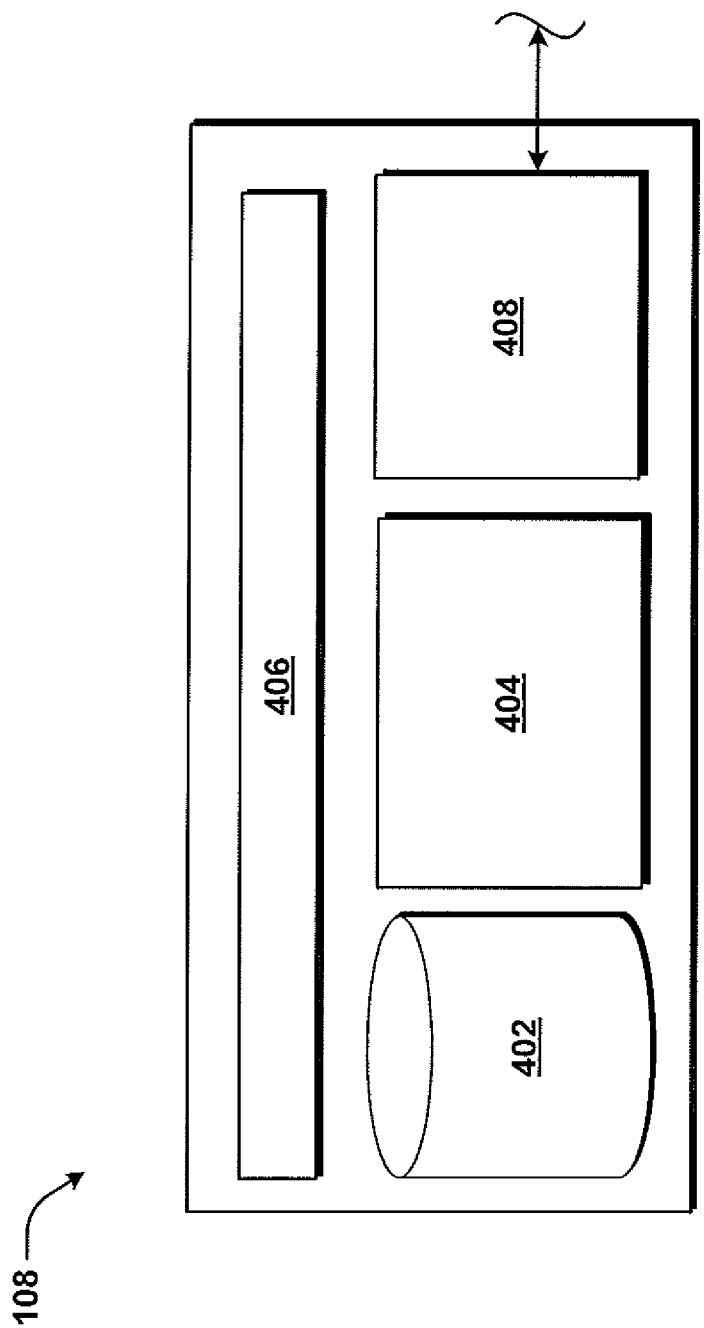
FIG. 4 is a computerized controller of the diagnostic system of FIGS. 1-3 and 5.

FIG. 4 illustrates a computerized controller 108 of the diagnostic systems 100, 100', 100" of FIGS. 1-3, according to an embodiment of the present disclosure. The computerized controller 108 includes a memory 402 and a processor 404 in communication with the memory 402 via a data bus 406. The memory 402 stores computer-readable instructions executable by the processor 404 to perform the functions of the diagnostic system 100, 100', 100", 500 described herein in connection with FIGS. 1-3, 5, and 6. The computerized controller 108 also includes a communication interface 408 facilitating communications to and from the controller 108.

The communication interface 408 includes one or more of a variety of input/output (I/O) connections for input/output of data. In some embodiments, the communication interface 408 is a hardwire connection, such as, for example, a USB, mini-USB, audio jack, PS2, IEEE 1394, serial, parallel, Ethernet (RJ48) port, RJ11 port, or the like. In some embodiments, the I/O interface 408 accepts other I/O devices such as, for example, keyboards, keypads, mice, interface tethers, stylus pens, printers, thumb drives, touch screens, multi-touch screens, touch pads, trackballs, joysticks, microphones, remote control devices, monitors, displays, liquid crystal displays (LCDs), other display devices, combinations thereof, and the like.

In some embodiments, the computerized controller 108 is configured to communicate with one or more local or remote devices such as a local remote control or a remote computer server. For communicating with a remote device, the processor 404 is configured to facilitate wired or wireless communications with an external communication network. Exemplary external communication networks include, but are not limited to, intranets, network databases, network storage systems, cellular networks, Voice over Internet Protocol (VoIP) networks, local area networks (LANs), wide area networks (WANs), personal area networks (PANs), and other communication networks. In some embodiments, the external systems are implemented using WIFI, WIMAX, combinations and/or improvements thereof, and the like.

Exemplary input data from the computer controller 108 includes programs in the form of computer-readable instructions, application initiation (start-up) requests, requests for analysis, requests for results or analysis, calibration orders, user IDs, and passwords. Exemplary output data includes raw sensor data and manipulated sensor data, reports, and instructions, such as instructions for disposition of a tested stator 102.

The memory 402 of the computer controller 108 can include any of a wide variety of computer-readable media, including, for example, volatile media, non-volatile media, removable media, and non-removable media. The term computer-readable media and variants thereof, as used in the specification and claims, refers to storage media. In some embodiments, storage media includes volatile and/or non-volatile, removable, and/or non-removable media.

For example, storage media includes random-access memory (RAM), read-only memory (ROM), electrically erasable programmable read-only memory (EEPROM), solid state memory or other memory technology, CD ROM, DVD, or other optical disk storage, magnetic tape, magnetic disk storage or other magnetic storage devices, or any other medium that can be used to store the desired information and that can be accessed by users.

Apparatus using Relative Motion

Figure 5:
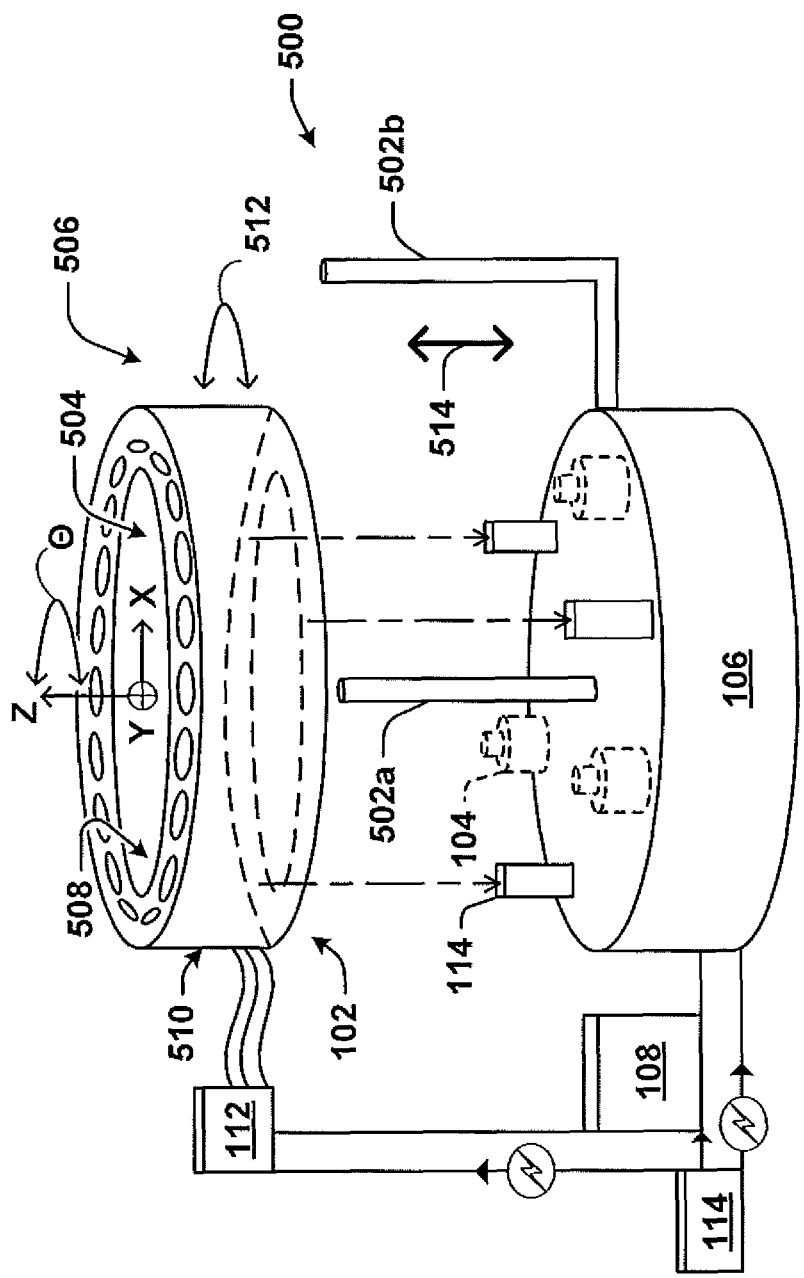
FIG. 5 is a front elevation of a diagnostic system for evaluating the stator, according to another embodiment.

FIG. 5 is a perspective view of a diagnostic system 500 for evaluating the stator 102 according to another embodiment of the present disclosure. The diagnostic system 500 of this embodiment includes one or more antennas 502. Although reference number 502 is used to describe antennas, primarily, a variety of sensor types may be used to accomplish the described functions, even those that are not commonly known as antennas.

The antennas 502 may be positioned at various locations and orientations with respect to the stator 102 and with respect to the balance of the diagnostic system 500. For example, although the antennas 502a/b are shown having vertical orientations at a central position and a lateral position with respect to the stator 102, respectively, the antennas 502a/b of some embodiments have horizontal orientations or orientations intermediate vertical and horizontal. And although the antennas 502a/502b are shown positioned at a central position and a lateral position with respect to the stator 102, respectively, the antennas 502 of other embodiments are positioned above the stator 102, below the stator, or partially above or below and partially lateral to the stator 102.

The antennas 502 may have any of various shapes and sizes without departing from the scope of the present technology. While generally straight antennas 502 are shown in FIG. 5, other potential shapes for the antennas 502 include bent, circular, oval, and rectangular. In some cases, a shape of the antennas 502 is selected by a designer of the diagnostic system 500 based at least in part on a shape and/or size of the electrical component (e.g., stator 102) to be analyzed. Similarly, in some cases, the size of the antennas 502 is selected by a designer of the system 500 based at least in part on the size and/or shape of the electrical component (e.g., stator 102) to be analyzed.

As shown in FIG. 5, the antennas 502a/b can be positioned within an interior area 504 of the stator 102 and at a lateral area 506 adjacent the stator 102, respectively. In some particular implementations, one or both of the antennas 502 are high-directivity antennas. One particularly type of antenna 502 is a patch antenna, also known as a Rectangular Microstrip Antenna. Another exemplary type of antenna 502 is a horn antenna, also known as a microwave horn. Horn antennas include a flaring waveguide, often made of metal. The waveguide, generally shaped like a horn, directs radio waves or other waves toward a sensing element, such s a RF sensing element.

For embodiments in which the inner antenna 502a has a sensing direction, the antenna 502a is positioned within the interior 504 of the stator 102 so that a sensing direction of the antenna 502 is directed outward toward an inner surface 508 of the stator 102. Similarly, outer antenna 502b having a sensing direction are positioned in the adjacent area 506 of the stator 102 so that the sensing direction is directed inward, toward an outer surface 510 the stator 102.

For sensing an entirety of the stator 102, the antennas 502 move relative to the stator 102. It will be appreciated that the relative motion can be achieved by moving the antennas 502 with respect to the stator 102. For instance, the inner antenna 502a could be caused to rotate in the angular direction Θ about an axis of rotation of the antenna 502a. As provided, the axis of rotation of the antenna 502a can be, but need not be, located generally along a Z direction. The axis of rotation of the inner antenna 502a is in some cases generally the same as an axis of the stator 102 (e.g., axis A and A' in FIGS. 1 and 2).

Relative motion between the outer antenna 502b is in some embodiments caused by orbiting or otherwise moving the outer antenna 502b around the stator 102. The motion of the outer antenna 502b can also be in the rotational direction Θ, generally about the axis A of the stator 102.

In some embodiments, instead of the antennas 502 rotating to create relative motion between the antennas 502 and the stator 102, the stator 102 is caused to turn, such as about the axis A, A'. In a contemplated embodiment, the antennas 502 and the stator 102 are both moved, such as by being rotated in opposite directions.

As described further below in connection with methods of operation, the relevant motion between the stator 102 and the antennas 502 is in some embodiments controlled by the controller 108, such as a computerized controller. By the relative motion between the stator 102 and antennas 502, the inner antenna 502a can scan an entirety of the inner surface 508 of the stator 102 and an outer antenna 502b can scan an entirety of the outer surface 510.

During scanning of the stator 102, a signal from the antenna 502 is monitored by signal-processing hardware. The signal-processing software may be a part of the antenna 502 or a part of the computer controller 108. The signal-processing software analyzes one or more aspects of the antenna signal, such as amplitude and frequency. Amplitude and frequency, and any change in amplitude and frequency over time, define a wave form, and the signal-processing software can also analyze the wave form over time. The controller 108 in some embodiments analyzes signal strength versus rotational, or angular position, and in some cases plots the strength with respect to the angular position. Such plotting, including three-dimensional mapping in some embodiments, is described in further detail below in connection with the method 600 of FIG. 6.

The controller 108 determines a rotational position of the stator 102 and/or the antenna 502 corresponding to a time at which an electrical fault in the stator 102 is sensed. Because output of an electrical fault disseminates, such as through the electrical part, the antennas 502 can sense output of the fault at various rotational locations of the stator 102. Because characteristics of output from an electrical fault are generally at their maximum closest to the fault, the controller 108 determines a rotational location of the fault by determining a position of the antennas 502 with respect to the stator 102 at which maximum output from the fault is sensed.

As described above, in some embodiments, the antenna 502 is selected or configured to sense only output of electrical faults above or below a predetermined level or threshold. For example, it may be determined by a designer of the system 500 that discharges smaller than a certain level, and therefore producing output below a certain level are not problematic—i.e., not expected to lead to failure during the operational life of the stator 102. The designer may arrive at this conclusion by way of testing, actual operation, feedback from the field in which stators 102 are being used, or otherwise.

The signal-processing software can also be configured to effectively lower sensitivity of the antenna 502 by processing only output above a certain level, within a certain range, or above and below certain levels. As described in connection with the embodiments of FIGS. 1-3, sensors 502 having lower sensitivity, or effective lower sensitivity (such as by signal processing), would be less likely to sense output other than a maximum output of a fault, but would not sense even maximum output outside of the sensitivity level the antenna 502.

In embodiments having an inner antenna 502a and an outer antenna 502b, signals from both antennas can be analyzed for accurately diagnosing an electrical fault. For example, the controller 108 can determine that the electrical fault is closer to the inner surface 508 or the outer surface 510 of the stator 102 depending on times at which the antennas sensed the output and/or based on a magnitude of output sensed by the antennas 502 with respect to the same discharge.

In some embodiments, a location of the fault is determined along a height dimension of the stator 102, e.g., the Z direction in FIG. 5. This determination may be performed along with determination of the angular or rotational location, and/or the lateral location—e.g., closer to the interior or exterior surface 508/510 of the stator 102.

In one embodiment, the antennas 502 are configured and arranged in the diagnostic system 500 to have sensitivity along a height of the antennas 502 in the Z directions, or to otherwise sense a location along the Z direction from which output of the electrical fault emanates.

In one contemplated embodiment, the antennas 502 extend at least partially above and/or below the stator 102. Portions of antenna 502 extending above and/or below the stator 102 provide data with which the controller 108 can determine a location of the fault along a height of the stator 102.

For instance, in cases having a portion of antenna 502 above the stator 102 to some extent, and a portion of antenna below the stator 502 to some extent, the controller 108 can determine whether the fault is closer to the upper antenna portion or lower antenna portion. In some contemplated embodiments, such an antenna 502 also determines a more particular indication of where between the antennas the fault is occurring, based on the times at which output is sensed by the respect portions of the antenna (e.g., upper and lower portion), and/or based on levels of output sensed by the upper and lower sensors portions.

In one contemplated embodiment, one or more antenna 502 move vertically, up, down, or up and down in any order, (for vertically-orientated arrangements, such as those shown in FIGS. 1, 3, and 5), or laterally (for horizontally-oriented arrangement—see e.g., FIG. 2) to facilitate relative motion between the stator 102 and antenna along the applicable direction (e.g., Z direction, X direction, or direction intermediate the Z and X). Analogous to the manner in which relative motion between the stator 102 antennas 502 can be created by movement of the stator and/or antennas 502, the relative motion in the applicable direction (e.g., Z or X direction) can be created by the antennas 502 being moved in the applicable direction with respect to the stator 102, the stator 102 can be moved in the applicable direction with respect to the antennas 502, or both the stator and the antennas can be moved in the applicable direction.

By way of the relative motion in the applicable direction, the antennas 502 can sense higher levels of fault output at certain positions (e.g. Z-direction positions) as compared with others, indicating where the fault lies in the applicable direction, height, longitudinal location, etc.

In some embodiments, the stator 102 rotates and the antennas 502 move in the Z direction during analysis of the stator. In a particular embodiment they move simultaneously as such. In some embodiments, the antennas 502 rotate and the stator 102 moves in the Z direction during analysis of the stator 102. In a particular embodiment they move simultaneously as such.

Aspects of the diagnostics systems 100, 100', 100" described above in connection with other embodiments can be included in the diagnostic system 500 of FIG. 5. For instance, as shown in FIG. 5, the system 500 can include any of the sensors 104 described in connection with other diagnostics systems 100, 100', 100". In this combined approach, the controller 108 uses data from both (i) the one or more antennas 502, having a particular location(s) (X, Y, Z) and angular orientation(s), and (ii) the multiple other sensors 104, in diagnosing an electrical fault. Particularly, for example, the computer-readable instructions stored in the memory 402 of the controller 108 cause the processor 404 to process data from the antenna(s) 502 and stationary sensors 104 to identify characteristics of the electrical fault, such as location and magnitude. This may involve processing data from various types of sensors (e.g., UV, acoustic, thermal) accordingly.

It has been found that use of these two types of sensors (one or more antennas 502 and the stationary sensors 104) can result in accurate determination of the location of a discharge in one or more linear directions (e.g., Z, X, and/or Y directions), such as along an axis A, A' of the stator 102 (axes shown in FIGS. 1 and 2). For this combined analysis, as provided, the processor 404 processes data from the antenna(s) 502 and the stationary sensors 104, together, to locate the source of discharge.

The diagnostic system 500 illustrated in FIG. 5 is otherwise the same as the diagnostic systems of previously-described embodiments.

In some embodiments, the computer-readable instructions are configured to cause the processor 404 to recognize inconsistent data. For example, the instructions can cause the processor 404 to determine that a sensation of one sensor, not being consistent with readouts of other sensors, should be considered aberrant and not considered in analyzing the stator 102.

Use of more sensors 104, 502 also increases an accuracy and reliability of diagnostic results from the diagnostic system 100. A designer of the system can balance the increased reliability and accuracy against a cost of using more sensors 104, 502.

As described above, and below in more detail, diagnosing the electrical fault in the stator 102 in some embodiments includes identifying a character or type of the fault based on output from the sensors 104, 502. For instance, the computer-readable instructions of the controller 108 are in those embodiments configured to cause the processor 404 to determine a likely cause of the fault or sub-system or component of the stator 102 in which the fault is occurring. These determination can be based at least in part on any one or more of a determined location of the fault, a magnitude of an output from the fault, a frequency of an output from the fault, and a wave form or other signature of the output, and in some cases a suggested remedy for the fault.

Methods of Operation

Figure 6:
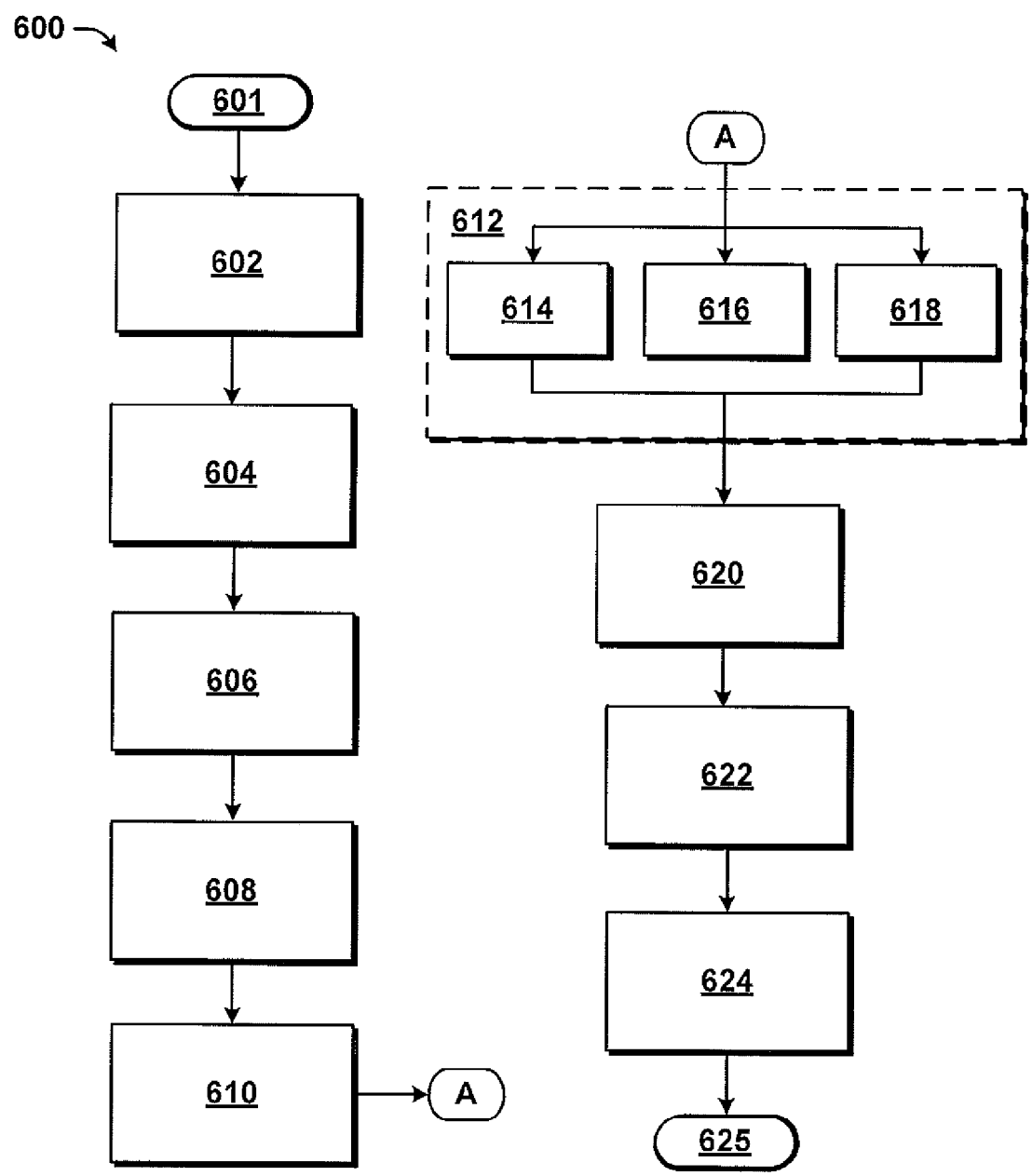
FIG. 6 is a schematic illustration of a method for diagnosing a fault in the stator using a diagnostic system according to FIGS. 1-5, and acting upon the diagnosis.

FIG. 6 is a schematic illustration of a method for diagnosing a fault in the stator 102 using any of the diagnostic systems 100, 100', 100", 500 described above in connection with FIGS. 1-5, and acting upon the diagnosis. It should be understood that the steps of the method 600 are not necessarily presented in any particular order and that performance of some or all the steps in an alternative order is possible and is contemplated.

The steps of the method 600 have been presented in the demonstrated order for ease of description and illustration. Steps can be added, omitted and/or performed simultaneously without departing from the scope of the appended claims. It should also be understood that the illustrated method 600 can be ended at any time.

The method 600 begins 601 and flow proceeds to block 602, whereat the electrical component to be analyzed and the diagnostic system 100, 100', 100", 500 are properly positioned adjacent each other. Although the particular electrical component analyzed by the present technology is not limited to a stator 102 of an electrical motor, analysis of a stator 102 is described by way of example. And although positioning the stator 102 and the diagnostic system adjacent each other is described primarily by way of embodiments in which the diagnostic system is mostly or completely stationary, and the stator 102 moved into place, in some contemplated embodiments, one or more parts of the diagnostic system are moved, instead of or along with moving the stator 102, in order to create the proper positioning between the stator 102 and diagnostic system.

As referenced above, the diagnostic system may be implemented on an assembly line or other manufacturing process. The system may of course be implemented in a testing environment separate from an assembly line. As also referenced above, positioning the stator 102 and the diagnostic system properly adjacent each other can be performed by a human operator, automated machinery, or a combination of personnel and automated machinery.

In some embodiments, a positioning sub-system, such as the exemplary positioning sub-system 302 illustrated in FIG. 3, is fully automated and in some embodiments partially automated. In the partially-automated embodiments, a person performs any of the acts involved with positioning 602 the stator 102 adjacent the diagnostic system.

In one embodiment, the positioning sub-system 302 obtains the stator 102, such as from a conveyor belt or other mechanism for delivering parts, and moves the stator 102 to a proper position adjacent the diagnostic system. For embodiments of the diagnostic system having isolation features, such as the isolation chamber 304 shown in FIG. 3, moving the stator 102 to the proper position includes moving the stator 102 through an opening of the chamber 304. As mentioned above, for the contemplated embodiment in which the chamber 304 does not include an opening part, the opening itself is referenced by numeral 306 in FIG. 3.

For embodiments of the present technology having an opening part 306, positioning the stator 102 within the chamber 304 and adjacent the diagnostic system include moving the opening part 306. As provided, the opening part 306 may be configured to be moved in a variety of ways, such as by being moved when contacted by the stator 102 and/or positioning sub-system 302, such as if the opening part 306 includes hanging or spring-loaded flaps.

In one embodiment, the opening part 306 automatically retracts or otherwise moves to an open position based on a position of the stator 102 or the positioning sub-system. For instance, the opening part 306 could automatically retract or otherwise move to an open position based on the stator 102 or the positioning sub-system being within a certain proximity of the opening part 306. In a particular implementation, the opening part 306 can be associated with a proximity sensor, or an open signal or other actuation can otherwise be initiated and relayed, such as from a sensor associated with an arm of positioning sub-system 306. The open signal or actuation can originate at the controller 108, receiving input from such motion detector or arm sensor, and sent to the opening part 306 in response to the positioning sub-system 302 being moved to a position in which the stator 102 is near or approaching the opening part 306. The opening part 306 may fully or partially close after the stator 102 enters the isolation chamber 304. As described above, the controller 108 can include human personnel and/or be computerized.

Positioning 602 the stator 102 adjacent the diagnostic system in some embodiments includes positioning the stator 102 at a certain, predetermined location. For instance, positioning the stator 102 is shown in FIG. 1 by downward movement arrows to include positioning the stator 102 on separators 116. The separators 116 control a vertical position (i.e., along the Z direction) of the stator 102 with respect to the diagnostic system 100. As also provided above, the separators 116 provide a damping function by absorbing vibrations or other movement of the stator 102 or sensors 104, 502 during operation of the diagnostic system 100.

As shown in FIG. 2, positioning the stator with respect to the diagnostic system 100' could include positioning the stator on a stand or base 202 for supporting the stator 102 in a horizontal orientation.

As described above, positioning of the stator 102 further includes locating the stator 102 in a certain orientation. More particularly, for example, positioning the stator 102 includes controlling an angular position of the stator 102 with respect to the base 106, or at least the sensors 104, 502, of the system 100. In an exemplary embodiment, angular positioning is accomplished by matching a feature of the diagnostic system with a feature of the stator 102. By way of illustration, the diagnostic system 100 in the embodiment of FIG. 1 is shown to includes alignment components 118 including a select one 116* of the separators 116 for engaging a notch or other alignment feature of the stator 102.

In some embodiments, the same component 116* and/or another alignment component of the diagnostic system operates to position the stator 102 properly in the lateral direction—e.g., X, Y in FIG. 1.

In one embodiment, lateral orientation (i.e., in the X and/or Y directions) is defined by the supports 116 (FIG. 1) matching up with the contacting surface of the stator 102.

While the alignment component 118 is shown to include a notch in the stator 102 and one of 116* the separators 116 of the diagnostic system 100 by way of example, illustration of the separators and notch is meant to illustrate schematically any feature of the diagnostic system 100 that functions to align the stator 102 with respect to the system 100. Similarly, the alignment features 118 are not shown in a limiting way with respect to a location, size, shape, or type of alignment feature, but rather is shown schematically for purposes of teaching.

With reference to FIG. 2, as provided above, the base 202 can control Z and Y axis positioning. The base 202 can also control X axis positioning because the person or machinery positioning the stator 102 can ensure that a predetermined feature of the stator 102 (e.g., a front or back edge, being to the left and right, generally in FIG. 2) is aligned with a corresponding feature of the base 202, such as a front or back edge of the base 202.

Proper positioning and orienting of the stator 102 with respect to the diagnostic system is important because diagnosing an electrical fault, including precisely determining a location of the fault, relies on specific relative positioning between the sensors 104, 502 and the stator 102 being analyzed.

With continued reference to FIG. 6, upon properly positioning the stator 102 with respect to the diagnostic system 100, the method 600 proceeds to block 604 at which the stator 102 is energized by connection to a power source. An exemplary power source or connection to such a source is referenced by numeral 114 in FIG. 1. Connecting the stator 102 to the power source can be a part of properly positioning 602 the stator 102 and the diagnostic system 100 adjacent each other.

Connecting the stator 102 to a power source includes connecting electrical wires 120 to the stator 102. As shown in FIG. 2, the diagnostic system 100' can include a connector 204 configured to electrically connect the stator 102 to the electrical wires 120. For instance, the base 202 and the connector 204 can define a cradle, and the stator 102 plugs into the connector 204 when the stator 102 is properly positioned in the cradle 202/204. The connector 204 is positioned for engagement adjacent an end, or side face of the stator. Although FIG. 2 shows the connector being at or proximate a bottom center location of the base 202, and so the stator 102 when positioned therein, in some embodiments, the connector 204 is positioned higher up the sides of the base 202. In one contemplated embodiment, the connector 204 is not directly connected to the base 202.

It will be appreciated that the connector 204 could also serve an alignment function, aligning the stator 102 in any of a variety of directions. In the embodiment of FIG. 2, the base 202 controls a positioning of the stator 102 in the Z and Y directions. In this case, the connector 204 can facilitate proper positioning of the stator 102 in the angular direction α and the X direction.

Once the stator 102 is properly positioned and electrically connected, flow of the method 600 proceeds to step 606 whereat current is sent to the stator 102 by way of the electrical wires 120. The provision of current can be initiated by the controller 108, being a human personnel and/or computerized (e.g., computer of FIG. 4). As described above, the diagnostic system 100 also includes a switch 112, or other intermediate electrical interface or junction, for use in controlling flow of current to the stator 102. The current can be provided as a direct current (DC) or an alternating current (AC), and the wires 120 can include a ground. The controller 108 controls current provided to the stator 102 by way of the switch 112, including controlling a voltage (DC or AC) supplied, and in some cases an amount of electrical power supplied.

Generally, it is desirable to supply current at a voltage up to at least a level of voltage at which the stator 102 is expected to operate during use in the field (e.g., in an electric motor on an automobile). This voltage can be referred to as operating voltage, and can correspond to a specified working voltage of the motor in which the stator 102 will be used.

In some embodiments, for a higher level of diagnosing, a voltage above the operating voltage is supplied. For instance, a designer of the diagnostic system can pre-establish a voltage level above the operating voltage of the stator 102 to supply to the stator 102. This level is, in some cases, for example, between about 100% of the operating voltage and about 150% of the operating voltage of the stator 102.

In some cases, the controller 108 causes the voltage supplied to the stator 102 to change over time. For instance, the voltage can be ramped up or down steadily, or be increased or decreased in regular or intermittent steps. Depending on the electrical component being analyzed and the level of voltage being supplied, it may be preferred to increase voltage steadily to avoid unwanted damage to the component, such as damage to wire insulation of the stator 102.

As described further below, the controller 108 in some embodiments considers the voltage level at which various levels of fault output are sensed. Faults occurring at lower voltage levels are generally considered more serious.

For example, the controller 108 may be programmed so that, if a particular stator 102 does not exhibit a determinable fault up through about 120% of its operating voltage, but fault is sensed when 200% operating voltage is supplied to the stator 102, the controller 108 will consider the stator 102 to pass inspection. The reasoning for such programming is that, considering that the stator 102 did not exhibit any fault well above its expected range of performance, it is expected that the stator 102 will not fail during its useful life in the field where it is not expected to experience voltages higher than its operating voltage.

In some embodiments, the preferred power-to voltage supplied to the stator 102 is about twice the operating voltage, plus a pre-set amount of volts, which can be referred to as an additional testing buffer, such as about 1,000 volts. A designer may define other desired test ranges. Generally, the test range should be high enough to at least simulate normal operation of the stator 102, and not too high so as to avoid causing damage to the stator 102, such as to the insulation surrounding the wires of the stator winding.

In some embodiments, characteristics of discharge at various levels of stator input (e.g., voltage) are considered in determining whether the stator 102 fails or passes. For instance, the controller 108 could be programmed so that, if the stator 102 exhibits only minimal discharge at a first level (e.g., 120% of its operating voltage), and the amount of discharge does not increase notably until a second level (e.g., 175%, of operating voltage), the part will be considered passing inspection.

In some embodiments, the controller 108 is programmed to identify any sharp increase in discharge, or leakage, occurring while the voltage is being steadily increased toward a specified maximum test voltage.

A designer of the diagnostic system could perform experiments to determine what levels of discharge, and at what voltages, lead to failures in actual operation of the stator 102, to determine what levels of discharge will be considered acceptable in the inspection.

At block 608, the sensors 104, 502 sense whether an output of the type that the sensors 104, 502 are configured to detect is present. As provided above, exemplary sensors 104, 502 include thermal, or heat sensors, UV sensors, acoustic sensors, EM sensors, and RF sensors. One or more sensors 104, 502 may be in the form of an antenna, such as the antennas 502 shown in FIG. 5. As provided, exemplary antennas include patch antennas and horn antennas. The diagnostic system can include any of a wide variety of sensors, such as by having three stationary sensors 104 of a thermal type and two patch antennas, sensing UV radiation.

At block 610, sensor data is generated by the sensors 104, 502 and processed by signal-processing software. Generating sensor data is performed while the stator 102 is appropriately energized. Generating sensor data can typically occur in a relatively-short period of time. For instance, in some embodiments, the stator 102 is energized for between about 30 seconds and about 60 seconds during the analysis. Timing of about 1 minute or less is generally sufficient for conforming to operation speed of an automotive assembly line.

Benefits of a shorter analysis time include minimizing a time affect on a manufacturing process in which the stator 102 is being tested, such as the assembly-line process in which the stators 102 passing inspection could be forwarded immediately to continued incorporation into a motor (step 624, described below).

As provided above, signal processing is performed within the sensors 104, 502 themselves in some embodiments, and by the controller 108 in other embodiments. It is also contemplated that some signal processing can be performed in both the sensors 104, 502 and in the controller 108.

As also referenced above, processing sensor data can include filtering sensor output data, or emission signals, to isolate only select results, such as data related to discharge output being above, below, or within a pre-determined threshold, for further analysis. Such isolation will avoid unwanted evaluation of or very-small discharges or non-events. Signal processing can also include common signal processing features such as signal amplification.

Signal processing 610 can also include processing the emission signals from an initial, or raw, state to data of a desired format. For instance, in some embodiments the signal processing software causes a processor (e.g., processor 404) to implement a processing algorithm such as a fast-Fourier transform (FFT) to separate the emission signal into desired frequency spectra.

As block 612 of the method 600, the controller uses the processed sensor information (e.g., a Discrete Fourier transform (DFT)), to diagnose a sensed fault or faults in the stator 102. The diagnosis can include analysis of information corresponding to various test conditions, such as times at which discharges were sensed and an input voltage provided to the stator 102 at the time.

As described above, the computer-readable instructions stored in the controller memory 402 can be configured to cause the processor 404 to recognize inconsistent data and not consider aberrant sensor output. This ability is pronounced in embodiments in which more than one type of sensor is used—e.g., stationary sensors 104 and sensors 502 that can use relative motion.e The diagnostic system is configured to diagnose multiple faults occurring in the same stator 102. For instance, various faults can be identified and located corresponding to respective voltages at which they occur, or produce their respective maximum discharges. This is because different types and severity of defects often result in differing discharge characteristics over a voltage range.

As provided above, the diagnosis 612 of faults can include various sub-functions including a sub-step 614 of identifying a location of the electrical fault in the stator 102, a sub-step 616 of identifying a magnitude of the electrical fault, and a sub-step 618 of identifying a frequency, wave form, other signature characteristic, or other characteristic of the fault.

Identifying 614 the location of a fault can be accomplished, by the processor 404 executing the computer-readable instructions, in a variety of ways. The particular manner in which the fault is located depends on the arrangement of sensors 104, 502 used. Three primary sensor arrangements are (I) sensor arrangements for diagnosing faults without need for relative motion between the sensors and the stator 102 (e.g., system of FIG. 1-3), (II) sensor arrangements using relative motion between the sensors 502 and the stator 102 (e.g., FIG. 5, not including sensors 104), and (III) a combined arrangement including sensors of both the first and second arrangements (I) and (II), as shown in the entirety of FIG. 5. Identifying location of the fault by way of each of these arrangements is addressed below in turn.

(I) Stationary Sensors Arrangements

For embodiments involving three or more sensors 104 that do not use relative motion in their operation, such as those shown in FIGS. 1-3, the controller 108 performs a geometric analysis of sensor data such as multilateration, trilateration, or triangulation. Sensor arrangements that do not require relative motion for diagnosing a fault can be referred to as stationary sensor arrangements.

As provided above, multilateration, or hyperbolic positioning, involves locating the fault by accurately computing the time difference of arrival (TDOA) of output from the fault sensed at three or more sensors 104, 502. And trilateration involves determining intersections of three sphere surfaces given the centers and radii of the three spheres. In the case of three sensors 104, the sensors 104 define respective centers of the three spheres.

The sensors 104 have known locations with respect to each other. The computer-readable instructions stored in the memory 402 of the controller 108 are configured to cause the processor 404 to compare the times at which the same output is sensed by respective sensors 104 to determine the location of the fault in three-dimensional space with respect to the sensors 104. Because the stator 102 is positioned in a predetermined location and predetermined orientation with respect to the sensors 104, the controller 108 can determine a location of the fault within the stator 102 based on the identified location of the fault in three-dimensional space with respect to the sensors 104.

(II) Relative-Motion Arrangements

Sensor arrangements that use relative motion for diagnosing a fault in the stator 102 can be referred to as relative-motion arrangements. As described above in connection with FIG. 5, antenna 502 using relative motion can be positioned in various positions adjacent the stator 102. For example, as shown in FIG. 5, an antenna 502a can be positioned within an inner area 504 of the stator, and an outer antenna 502b can be positioned adjacent the stator 102 in an outer area 506. As also provided above, relative motion is created between the antennas 502 and the stator 102 by moving the stator, moving the antennas 502, or moving both the antennas 502 and the stator 102.

For identifying a location of the fault using a relative-motion arrangement, the sensors 502 sense various levels of discharge, between a maximum down to perhaps zero output, depending on a position of the antenna 502 with respect to the stator 102. For instance, for embodiments involving angular, or rotational relative motion between the stator 102 and the antenna 502, the antenna 502 typically senses lower levels of output just before and just after sensing a maximum output of the discharge during the relative motion. Relative motion is indicated in FIG. 5 by arrow 512.

A maximum output sensed by the antenna 502 generally indicates the location of the fault. For example, the computer-readable instructions stored in the memory 202 are configured to cause the processor 404 of the controller 108 to determine that a fault is located at a particular angular location of the stator 102 if an antenna 502 senses a maximum output while the antenna 502a is directed toward that particular angle $\Theta$ with respect to the stator 102.

For embodiments involving two antennas 502a, 502b, the instructions can cause the controller 108 to consider respective angular positions $\Theta a$, $\Theta b$ at which maximum outputs are sensed in determining a location of the fault. As provided, use of more sensors 502, 104 generally results in more accurate results.

For embodiments involving linear relative motion between the stator 102 and the antenna 502, the antenna 502 may sense lower levels of output before and after sensing a maximum output of the discharge. The linear motion may be vertical, horizontal (reference is made to FIG. 2), or along a line between horizontal and vertical. Vertical motion is describe further, and shown in FIG. 5 by arrow 514, indicating relative linear motion, only by way of example.

Again, the maximum discharge output sensed typically indicates a location of the fault, here being a location along the Z direction. Thus, the computer-readable instructions stored in the memory 202 are configured to cause the processor 404 of the controller 108 to determine that the fault is at a certain height in the Z direction of the stator 102 if an antenna 502 senses a maximum output while the antenna 502 senses the maximum output while the antenna 502 is at the certain height, or otherwise senses the maximum output being at the certain height, or vertical location in the Z direction.

And again, for embodiments involving two antennas 502a, 502b, the computer-readable instructions stored in the memory 202 are configured to cause the processor 404 of the controller 108 to consider the respective heights at which maximum discharge outputs are measured in determining a location of the fault. Again, use of more sensors 502, 104 generally results in more accurate results.

In some embodiments, the angular position of a defect is located using at least three stationary sensors 104 and at least one relative-motion sensor 502. In response to detecting an angular position of a fault, relative motion between the antenna (s) 502 and the stator 102 is caused (e.g., the antenna/s 502 are driven up and/or down) to determine an axial (Z-direction in FIG. 5) location of the fault.

For embodiments, having both the inner and outer antennas 502a, 502b, the controller 108 can be configured to compare the times at which the respective antennas sense output from the fault (i.e., time-of-flight analysis) to determine a lateral location of the fault, between the inner and outer antennas 502a, 502b, at the angular location of the outer antenna 502b.

In some embodiments, multiple faults are identified, when present, by the controller 108 evaluating significant peaks of discharge sensed by the various sensors 104 and/or 502, and patterns of the detected signals, such as changes in magnitude or other characteristics with time or with change in voltage or power input to the stator 102. For instance, the controller 108 can correlate the signals from sensors 104 and 502 to determine a number of faults and their respective locations.

In one contemplated embodiment, one antenna 502a or 502b, moves with a relative angular displacement with respect to the stator 102 and the other antenna 502b or 502a moves with a relative linear displacement with respect to the stator 102 (e.g., in the Z direction). These relative motions, and corresponding sensors in some embodiments occur simultaneously.

As described above, the relative motion could be created by moving the antennas 502, the stator 102, or both. Thus, for instance, in one embodiment, the inner antenna 502a moves vertically, up, down, or up and down in any order, and the outer antenna 502b moves around the stator 102.

In another embodiment, the outer antenna 502b moves vertically, up, down, or up and down in any order, and the inner antenna rotates with respect to the stator 102. In yet another embodiment, the stator 102 rotates while one or both of the antennas 502 move vertically. In still another embodiment, the stator 102 is moved vertically and at least one of the antennas 502 is rotated or caused to move around the stator 102. These are only exemplary motions, and other similar types of motion of the stator and sensors 502 can be performed and are considered as part of the present technology.

(III) Combined Arrangement

As provided above, and shown in the entirety of FIG. 5, the diagnostic system may include both a stationary-type arrangement and a relative-motion arrangement. For this embodiment, the computer-readable instructions stored in the memory 402 of the controller 108 are configured to cause the processor 404 of the controller 108 to process information from the sensors 104 associated with the stationary arrangement and the sensors 502 associated with the relative-motion arrangement. Generally, the controller 108 of this embodiment can diagnose a fault, including determining location, with greater accuracy using the increased sensor information as compared to the first and second arrangements (I), (II), alone. Again, whether to implement of more sensors and/or more types of sensors is decided at the discretion of a designer of the diagnostic system based on factors including desired accuracy and cost.

As provided above, in a combined configuration, such as that shown in the entirety of FIG. 5, angular position of a defect can be located using three stationary sensors 104 and at least one relative-motion sensor 502. And, in response to detecting the angular position, relative motion can be affected (e.g., in the Z direction of FIG. 5) between the antenna (s) 502 and the stator 102 to determine an axial (Z-direction in FIG. 5) location of the fault.

As also provided regarding the combined configuration, multiple faults, when present, can be diagnosed by the controller 108 evaluating sensor data from both the stationary and relative-motion sensors 104, 502.

In one embodiment, using any of the three arrangements (I), (II), and (III), the diagnostic system is arranged so that sensors are focused on a certain one or more areas of the stator 102. The focus may be selected based on one or more of a variety of factors. For example, the focus is in some particular embodiments selected to include a traditional problem area for the stator 102, an area at which the stator 102 is most likely to fail, or an area at which faults are considered most serious, such as by being in a critical portion of the stator 102.

With further reference to FIG. 6, at sub-step 616, the processor 404, executing the computer-readable instructions stored in the memory 402 of the controller 108, identifies a magnitude of the discharge caused by the fault. The magnitude of the discharge determined is in some cases stored locally, or sent to a remote location for storage, for later processing.

The magnitude sensed or sensed and stored can include a single magnitude (e.g., a maximum magnitude) or a distribution of magnitudes. An exemplary distribution includes a minimum to a maximum magnitude as associated with at least one variable such as locations (e.g., angular location, or location in two or three dimensions) and voltage input to the stator 102 corresponding to the various magnitudes. The distribution can be plotted or mapped, in two or three-dimensional space, depending on the type of data at hand.

At sub-step 618, the processor 404, executing the computer-readable instructions stored in the memory 402 of the controller 108, identifies a frequency, wave form, other signature characteristic of the fault, or other characteristics of the fault. Diagnostic information such as regarding a frequency or wave form of discharge emanating from the fault can be used, for example, in determining a type of the defect creating the discharge. This determination is described next, in connection with step 620. The fault characteristics identifies in step 618 can be stored locally, or sent to a remote location for storage, for later processing.

At sub-step 620, the processor 404, executing the computer-readable instructions stored in the memory 402 of the controller 108, identifies a type of defect that is creating the discharge and/or identifies a source or root cause. Regarding determining a type of the fault, one variable considered by the controller 108 is a location of the fault. In one embodiment, the type of fault is defined at least in part by the certain portion of the stator 102 at which the fault is determined to be located. For instance, a fault in a beginning of a wire coil or winding (e.g., a junction) can be considered to be a junction-type fault, or more particularly a start-of-coil junction type fault.

As another example of determining a type of the fault, the computer-readable instructions may be configured to cause the processor 404 of the controller 108 to recognize that a fault at a specific portion of the stator 102 is most likely due to a specific type of fault. The computer-readable instructions may be configured to cause the processor 404 of the controller 108 to consider information from test analyses of the same kind of stator 108 and/or data procured in connection with evaluation (using the present technology and/or otherwise) of one or more stators 102 used in the field (e.g., actually used in the motor on a customer or test automobile). Various data for such evaluations can be entered into the controller 108, or other computer processor, automatically as a result of operation of the diagnostic system and/or input by personnel.

In one embodiment, faults located at one or more particular portions of the stator 102 are considered to be correctible. In one embodiment, faults located at one or more certain portions of the stator 102 are considered to be non-correctible. For instance, in a specific embodiment, the controller 108 is programmed to determine that faults located at a crown section 127 (see FIG. 1) of the stator 102 or at welded ends 129 (FIG. 1) of the stator 102, are correctable. In another specific embodiment, the controller 108 is programmed to determine that a fault located within slots of a lamination stack 121 of the stator 102 is non-correctable. In some scenarios, stators 102 having faults determined to be non-correctible are recycled or scrapped.

Although FIG. 6 shows step 620 separate from the features of step 612, the step 620 could be a part of the diagnosing step 612, such as by being an additional sub-step thereof.

At step 622, the processor 404 of the controller 108, executing the computer-readable instructions stored in the memory 402 of the controller 108, categorizes, or classifies the analyzed stator 102. In a simple example, the controller 108 is configured to categorize the stator 102 as pass or fail based on whether a discharge is present, or whether a discharge is present having certain characteristics, such as a maximum output above, below, or within a predetermined threshold at a certain condition (e.g., at certain input voltage).

In one embodiment, the controller 108 categorizes the stator 102 as pass, fail, or remediable based on characteristics of the discharge sensed. For instance, the computer-readable instructions of the controller 108 can cause the processor to categorize a stator 102 as remediable, or fix, if only a slight, though still unacceptable discharge is detected. The reason for such programming is that it has been determined that in these type of situations only light touchup work is needed to make the stator 102 pass. The designer of the system can determine what parameters should be programmed into the instructions for making a fix categorization based on factors such as past test results, including information about fixed and retested stators 102, and information from parts used in the field. Exemplary fixes include dipping the stator 102 in an insulation bath (i.e., dip coating) for contact or full immersion of a problem area, or more or all of the stator 102 more broadly. Another exemplary simple fix includes adding an appropriate tape, glue, or other adhesive to the problem area of the stator 102.

Another variable that the computer-readable instructions of the controller 108 can be configured to cause the processor 404 to consider is, in determining whether a fault is remediable, a depth within the stator 102 of the fault. That is the controller 108 can, using the location information for the fault, consider whether the fault is on a surface of the stator 102, making it generally more remediable, versus being deep within the stator wire coils, making it generally less remediable.

Continuing with FIG. 6, Step 624 represents various actions that can be performed following diagnosis of the stator fault. If the diagnosis results in a determination that the stator 102 fails, the resulting action could be to recycle or scrap the stator 102.

If the diagnosis results in a determination that the stator 102 is not acceptable, but remediable, the stator 102 is repaired. The repair can occur in a general area of the diagnostic system or a location remote to the diagnostic system. It may be that a very easy fix, such as selective application of tape, would be done locally while a more involved fix would be done farther away, such as in another area of a manufacturing plant. The controller 108 could identify that type of repair suggested or needed, and in some embodiments also an area (e.g., a repair area or room of an assembly plant) corresponding to the suggested repair.

If the stator 102 is moved for repair or further analysis, information from the controller 108 relating to the stator 102 can be made available to personnel, a computer, and/or automated machinery at the area of repair. For instance, an diagnostic data, such as location of the fault and suggested remedy, can be sent by wired connection or wirelessly to a location at which a repair will be performed. Repaired parts can be routed for retesting according to the teachings of the present disclosure.

Passing stators 102 can be immediately processed for continued implementation into the end product. For instance, the stator 102 can be moved toward imminent inclusion into a motor, or added to batch of good stators 102.

Diagnostic data can also be stored or transferred for storage or further processing in connection with passing stators 102, as well. The data can be used for analysis (e.g., statistical analysis) and possibly used later to subsequently diagnose or repair a previously passing stator 102 now being used in the field (e.g., on a customer car) and for some reason exhibiting fault characteristics. In this embodiment, the diagnostic data is stored in connection with an identifier for the stator 102, such as in connection with a unique part code for the particular stator 102, or a unique identification code (e.g., VIN) associated with the end product (e.g., motor or vehicle) in which the stator 102 is used.

The diagnostic data for all stators, or just a certain type or category (e.g., passing, failing, or remediable) can be stored and processed, such as in a statistical analysis. Benefits of such processing include, for instance, identifying common problems in stators. The additional processing may also help determine which repair actions for remediable stators 102 are more effective and which are less effective, which can determination can be used in further programming the computer-readable instructions of the controller 108. As still another example, the diagnostic data can enable detection by the controller 108 or other person or computer, of patterns of defects, such as stators 102 coming from the same second-tier supplier, or by way of a certain shipper, but not others.

Processing diagnostic data can also include developing plots, maps, or logs, of discharge or corona signal strengths identified in a single stator 102 or in connection with numerous stators. Exemplary samples include all stators made in a particular run, created or tested in a particular run, day, week, month, or year, or coming from a certain supplier or stator-manufacturing location or area of a plant. Maps can be two or three-dimensional based on available data, such as whether the fault was located in three-dimensions or just two by the controller 108.

The computer-readable instructions of the controller 108 can cause the processor 404, or another computer can generate logs, maps, or plots automatically. The generation could be based on a trigger, such as identification of a seriously faulting or failed stator 102, or a bad batch of stators from a certain supplier or within a certain period of time. In one embodiment, maps are generated automatically at predetermined times, such as at the end of a testing shift, or at pre-set intervals, such as hourly, daily, monthly, or quarterly.

Mapping, logging, or plotting data can be used to identify patterns, such as particularly portions of the stator 102 causing problems, a source of many faulting stators 102 (e.g., a supplier or in-plant processing step), etc.

Mapping enables establishment of corona or partial discharge limits per square area. For instance, it may be determined that wire insulation is commonly missing from a certain portion of the stator 102 by being scraped away during the manufacturing process, such as during a wire-bending sub-process or by way of unwanted contact between the insulation and burrs at slot edges of the laminations. Using the mapping information, a step in the process of making or transporting the part can be improved to avoid the scraping.

In some embodiments, the mapping information is used to establish one or more thresholds for distinguishing between acceptable and unacceptable discharge. In a particularly embodiment, such a threshold is in the form of a limit per square area (e.g., centimeter) of the stator 102. In a particularly embodiment, potential variables for consideration in determining the one or more thresholds are a length of the lamination stack and a density of the wires within the stator 102.

In some embodiments, the threshold(s) relate to one or more of a maximum output of the discharge, a width of a discharge, a voltage being provided to the stator 102 when the discharge is measured (e.g., when maximum output sensed), an electrical power being provided to the stator 102 when the discharge is measured (e.g., when maximum output is sensed), a frequency of the output, a location of the output, and an estimated size of the defect. The controller 108 is in same cases programmed to determine an estimated size of the defect based on a height and width of a corresponding peak in discharge output from the fault.

A resulting map may be embodied in any of a wide variety of formats. Exemplary formats include spreadsheets, charts, and graphs.

Diagnostic data may be stored locally, such as in the memory 402 of the controller 108 and/or stored remote to the diagnostic system. The data can be transferred to a remote location (e.g., a remote computer) in a variety of ways, including by wired or wireless transmission, by compact disc, memory stick, etc.

In these ways, the diagnostic system and presently described methods support design and manufacturing quality-improvement efforts.

The method 600 may end 625, or be repeated for other electrical components.

Conclusion

The technology of the present disclosure allows automated rapid detection and locating of faults in an electrical component causing electrical corona or partial discharge, and before a short or arc occurs. Faults can be automatically detected whether they are occurring on a surface of the electrical component or at an interior location. To the contrary, use of manual UV cameras are limited to sensing UV discharge output only for faults occurring on a surface of the component. Thus, it is not required to disassemble the electrical component to diagnose electrical faults therein.

The present technology presents a partially or fully-automated approach to diagnosing a fault, including determining a location of the fault and whether the fault can be repaired. This ability has cost and efficiency benefits, such as by promoting time savings in high-volume manufacturing systems (e.g., automotive assembly lines). Also, the system can identify, very early, concerns with the assembly due to partial discharge problems. The sensors (e.g., ultrasonic sensors) have the capability to detect high-frequency output (e.g., noise) generated at an early stage of corona phenomena, before arcing takes place.

Also, in identifying good electrical components, components that can be fixed, and bad components according to the present technology, (a) bad components are diagnosed with greater reliability, (b) scrap is reduced because marginal components can be repaired based on the more-detailed information from the diagnostic system, (c) overall product quality is increased, and (d) any needed evaluation of the part after operation in the field is improved by availability of component-specific information resulting from the prior evaluation by the diagnostic system.

Various embodiments of the present disclosure are disclosed herein. The disclosed embodiments are merely examples that may be embodied in various and alternative forms, and combinations thereof.

The law does not require and it is economically prohibitive to illustrate and teach every possible embodiment of the present claims. Hence, the above-described embodiments are merely exemplary illustrations of implementations set forth for a clear understanding of the principles of the disclosure. Variations, modifications, and combinations may be made to the above-described embodiments without departing from the scope of the claims. All such variations, modifications, and combinations are included herein by the scope of this disclosure and the following claims.

What is claimed is:

1. A method for diagnosing a fault in an electrical component using a diagnostic system having at least three stationary sensors, comprising:

positioning the electrical component in a predetermined position adjacent the diagnostic system and at a predetermined orientation with respect to the diagnostic system;

causing a predetermined level of electrical current to flow to the electrical component;

sensing, by the stationary sensors, electrical discharge emitted by the electrical component at an area of the fault;

receiving, by a tangible computerized controller executing computer-readable instructions, sensor data from the stationary sensors;

executing, by the tangible computerized controller, the computer-readable instructions to process the sensor data to generate test information including a location of the electrical component at which the fault is occurring in at least two dimensions, the location including a depth of the fault;

executing the computer-readable instructions to classify the electrical component as remediable or failed based on the depth of the fault determined by the computerized controller; and implementing, in response to classifying the electrical component as remediable, a remedial action to be taken to correct the fault.

2. The method of claim 1, wherein:

causing a predetermined level of electrical current to flow to the electrical component is performed by the tangible computerized controller executing the computer-readable instructions; and executing, by the tangible computerized controller, the computer-readable instructions to cause the predetermined level of electrical current to flow to the electrical component, includes executing the instructions to cause flow of the electrical current at a plurality of different voltage levels over time including a voltage level of at least 100% above a specified operating voltage of the electrical component.

3. The method of claim 1, wherein executing, by the tangible computerized controller, the computer-readable instructions to generate the test information causes the controller to perform a geometric evaluation selected from a group of evaluations selected from:
   trilateration; and
   multilateration.

4. The method of claim 1, wherein processing the data to generate test information including the location of the electrical component at which the fault is occurring includes determining the location having three-dimensions.

5. The method of claim 1, wherein positioning the electrical component in the predetermined position and at the predetermined orientation adjacent the diagnostic system includes:
   positioning, by an automated positioning sub-system of the diagnostic system, the electrical component within an isolation chamber, comprising transferring the electrical component through an opening of the chamber; and
   connecting the electrical component to an electrical connection that is in turn connected to a power source for supplying the current to the electrical component.

6. The method of claim 1, wherein:
   each of the sensors has a type selected from a group of sensor types selected from:
      thermal sensor;
      ultraviolet sensor;
      acoustic sensor;
      electromagnetic sensor; and
      radio frequency sensor;
      sensing the discharge emitted by the electrical component using the stationary sensors comprises sensing the discharge emitted by the electrical component at an area of the fault; and
   receiving the sensor data by the tangible computerized controller includes receiving the sensor data from the stationary sensors.

7. The method of claim 1, wherein:
   the electrical component is selected from a group of particular electrical components consisting of:
   a stator for an electric motor; and
   a rotor for an electric motor; and
      positioning the electrical component in the predetermined position and the predetermined orientation adjacent the diagnostic system includes positioning the selected particularly electrical component in the predetermined position and the predetermined orientation adjacent the diagnostic system.

8. The method of claim 1, further comprising executing, by the tangible computerized controller, the computer-readable instructions to generate a report based on the sensed data, the report including a three-dimensional mapping of the fault.

9. The method of claim 1, wherein:
   executing, by the tangible computerized controller, the computer-readable instructions to process the sensor data to generate the test information comprises processing the sensor data to generate the test information at a time of initial evaluation; and
   the method further comprises considering the test information generated with respect to the electrical component at the time of initial evaluation at a later evaluation time, after the electrical component has been used by a user and exhibited a problem.

10. The method of claim 1, wherein the electrical component is classified as remediable when the depth is indicative of the fault being on a surface of the electrical component.

11. A method, for diagnosing a fault in an electrical component using a diagnostic system having at least two directional sensors, comprising:
   positioning the electrical component in a predetermined position adjacent the diagnostic system and at a predetermined orientation with respect to the diagnostic system;
   effecting relative motion between the sensors and the electrical component;
   causing a predetermined level of electrical current to flow to the electrical component;
   sensing, by the sensors, electrical discharge emitted by the electrical component at an area of the fault while the relative motion is being effected and the current is flowing to the electrical component;
   receiving, by a tangible computerized controller executing computer-readable instructions, sensor data from the sensors;
   executing, by the tangible computerized controller, the computer-readable instructions to process the sensor data to generate test information including a location of the electrical component at which the fault is occurring in at least two dimensions, the location including a depth of the fault;
   executing, by the tangible computerized controller, the computer-readable instructions to classify the electrical component as remediable or failed based on the depth of the fault determined by the computerized controller; and
   implementing, in response to classifying the electrical component as remediable, a remedial action to be taken to correct the fault.

12. The method of claim 11, wherein:
   each of the sensors has a type selected from a group of sensor types selected from:
      a horn antenna; and
      a patch antenna;
      sensing the electrical discharge emitted by the electrical component using the sensors includes sensing the electrical discharge emitted by the electrical component at an area of the fault; and
   receiving the sensor data by the tangible computerized controller comprises receiving the sensor data from the sensors.

13. The method of claim 11, wherein:
   executing, by the tangible computerized controller, the computer-readable instructions to process the sensor data to generate the test information includes executing the instructions to process the sensor data to generate the test information at a time of initial evaluation; and
   the method further comprises considering the test information generated with respect to the electrical component at the time of initial evaluation, at a later evaluation time, after the electrical component has been used by a user and exhibited a problem.

14. The method of claim 11, wherein the electrical component is classified as remediable when the depth is indicative of the fault being on a surface of the electrical component.

15. A diagnostic system for diagnosing an electrical component, the diagnostic system comprising:
   at least two sensors for sensing a discharge emitted by a fault of the electrical component; and
   a computerized controller being operatively connected to the sensors and comprising a processor and a memory having computer-readable instructions-that, when executed by the processor, cause the processor to perform operations comprising:

receiving sensor data from the sensors;
processing the sensor data to generate test information including a location of the electrical component at which the fault is occurring in at least two dimensions, the location including a depth of the fault;
classifying the electrical component as remediable or failed based on the depth of the fault determined by the computerized controller; and
initiating, in response to classifying the electrical component as remediable, a remedial action to be taken to correct the fault.

16. The diagnostic system of claim 15, wherein each of the sensors has a type selected from a group of sensor types selected from:
thermal sensor;
ultraviolet sensor;
acoustic sensor;
electromagnetic sensor;
radio frequency sensor;
a horn antenna; and
a patch antenna.

17. The diagnostic system of claim 15, wherein:
at least two of the sensors are directional antennas;
the system further comprises an apparatus for causing relative motion between the electrical component and the directional antennas;
the antenna are configured to sense the discharge while the apparatus is causing the relative motion;
the apparatus is configured to cause the relative motion with respect to a first antenna of the at least two antennas being relative motion selected from a first group of relative motions consisting of:
linear relative motion between the antennas; and
angular relative motion; and
the apparatus is configured to cause the relative motion with respect to a second antenna of the at least two antennas being relative motion selected from the first group of relative motions.

18. The diagnostic system of claim 17, wherein at least two of the sensors are stationary sensors having a type selected from a group of sensor types selected from:
thermal sensor;
ultraviolet sensor;
acoustic sensor;
electromagnetic sensor; and
radio frequency sensor.

19. The diagnostic system of claim 15, wherein the electrical component is classified as remediable when the depth is indicative of the fault being on a surface of the electrical component.

* * * * *